(12) United States Patent
Yura

(10) Patent No.: US 6,426,521 B1
(45) Date of Patent: Jul. 30, 2002

(54) SEMICONDUCTOR DEVICE

(75) Inventor: Masashi Yura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/614,274

(22) Filed: Jul. 12, 2000

(30) Foreign Application Priority Data

Jul. 12, 1999 (JP) .......................................... 11-197260

(51) Int. Cl.$^7$ ............................................... H01L 29/74
(52) U.S. Cl. ...................................................... 257/124
(58) Field of Search ................................. 257/119, 122, 257/124, 126, 127, 139, 212, 634

(56) References Cited

U.S. PATENT DOCUMENTS 5,286,984 A * 2/1994 Nakagwa et al. ............ 257/139
5,859,446 A * 1/1999 Nagasu et al. ............... 257/174

* cited by examiner

Primary Examiner—Fetsum Abraham
Assistant Examiner—Leonardo Andújar
(74) Attorney, Agent, or Firm—Burr & Brown

(57) ABSTRACT

In a semiconductor device of self-extinguish type, in which a channel constituting a current path is controlled by a control voltage applied to a gate electrode, the channel is constructed between an n type cathode region 12 formed in one major surface of n silicon substrate 11 and p type anode region 15 formed in the other major surface of the silicon substrate is opened and closed by the control voltage applied to a gate region 14 as well as a guard region. The guard region is formed by p$^+$ type guard regions 18 and 19 provided adjacent to the channels, and a p type auxiliary guard region 20 formed between the p$^+$ type guard regions 18 and 19 and having a lower impurity concentration than that of the guard regions 18 and 19. During the conduction state, electrons are hardly diffuse laterally underneath the guard region, and therefore upon the turn-off operation, electrons can be taken out at a high speed. Since electrons are taken out uniformly, the electrical field is not concentrated and the semiconductor device is effectively prevented from being broken.

23 Claims, 7 Drawing Sheets

SEMICONDUCTOR DEVICE

BACKGROUND OF THE INVENTION

1. Field of the Invention

The present invention relates to a semiconductor device comprising a semiconductor substrate made of a semiconductor material having one conductivity type and including mutually opposing first and second major surfaces, a first major electrode formed on said first major surface of the semiconductor substrate, a control electrode formed on said first major surface of the semiconductor substrate, a control region of the other conductivity type formed in the semiconductor substrate underneath said control electrode, and a second major electrode formed on the second major surface of the semiconductor substrate, wherein a current flowing between said first major electrode and said second major electrode through a channel formed within the semiconductor substrate is controlled by a control voltage applied to said control electrode.

2. Description of the Related Art

Heretofore, there have been proposed various kinds of semiconductor devices of the kind mentioned above. For instance, gate turnoff thyristors, power bipolar transistors, static, induction transistors and static induction thyristors have been developed.

FIG. 1 is a cross sectional view showing a typical static induction transistor of the buried gate type. N type source regions 2 are formed on one major surface of an n⁻ type semiconductor substrate 1, and source electrodes 3 are formed on the source regions 2. In the other major surface of the semiconductor substrate 1 is formed a drain region 4 of n or n⁺ type and a drain electrode 5 is formed on the drain region 4.

Under the source regions 2, there are formed buried gate regions 6 of p⁺ type, and these gate regions are connected to a gate electrode 7 formed between adjacent source regions 2 formed in the one major surface of the semiconductor substrate 1. Under the gate electrode 7, there is formed a p⁺ guard region 8 for realizing a high blocking voltage. When the semiconductor substrate 1 is made of n type semiconductor material, the guard region 8 is formed to have the p conductivity type, and the guard region is connected to the gate regions 6. Usually, the guard region 8 is formed by a diffused region having a depth not less than 3 $\mu$m such that a sufficiently high blocking voltage can be attained upon cutting-off the current. It should be noted that in order to improve the controllability of the guard region 8 by decreasing a contact resistance with respect to the gate electrode 7, the guard region 8 has a rather higher surface impurity concentration and has a large width. Therefore, the potential is equal over the whole area under the guard region 8.

A DC supply source 9 is connected across the source electrode 3 and the drain electrode 5. For instance, if the transistor is a normally-on type, when zero gate voltage is applied to the gate electrode 7, a channel is opened and a current flows from the source electrode 3 to the drain electrode 5 through the channel. When a negative gate voltage is applied to the gate electrode 7 with respect to the source, a depletion region spreads from the gate regions 6 and the channel is closed and the current flowing from the source electrode 3 to the drain electrode 5 is cut-off.

In the above mentioned semiconductor device, in the conduction state in which the channel is opened and the current flows between the source regions 2 and the drain region 4, a potential applied to electrons situating just below the guard region 8 becomes lower and electrons injected from the source region 2 diffuse laterally beyond the channel region. Therefore, a concentration of electrons just below the guard region 8 becomes higher. That is to say, a larger number of electrons exist at an area remotely from the channel. When the device is turned-off, it is required to take out these electrons existing in a region just below the guard region 8 remote from the channel. However, since the electron concentration at that region is rather high, it is impossible to take out or withdraw a large number of electrons within a short time period. In this manner, in the known semiconductor device, the turn-off operation could not be performed at a high speed.

Moreover, during the turn-off operation, electrons existing in the region far from the channel must be taken out, and therefore the turn-off operation within such a region is liable to be delayed and uniform operation could not be attained. As a result, the semiconductor device is liable to be destroyed. This is particularly important for high speed operation.

SUMMARY OF THE INVENTION

The present invention has for its object to provide a novel and useful semiconductor device, in which the turnoff operation can be performed at a high speed and a wider safety operating area can be attained.

According to the invention, a semiconductor device comprises:

a semiconductor substrate made of a semiconductor material having one conductivity typo and including mutually opposing first and second major surfaces;

a first major electrode formed on said first major surface of the semiconductor substrate;

a control electrode formed on said first major surface of the semiconductor substrate;

a control region of the other conductivity type formed in the semiconductor substrate underneath said control electrode; and a second major electrode formed on the second major surface of the semiconductor substrate;

wherein a current flowing between said first major electrode and said second major electrode trough a channel formed in the semiconductor substrate is controlled by a control voltage applied to said control electrode, and said control region is formed to have a portion whose impurity concentration is reduced in accordance with an increase in a distance from the channel.

In a preferable embodiment of the semiconductor device according to the invention, said control region consists of a first impurity diffused region adjacent to the channel and a second impurity diffused region situated on a side of said first impurity diffused region opposite to the channel. In this case, said first and second impurity diffused regions may be spatially separated from each other or may be partially overlapped with each other. Furthermore, an impurity concentration of said first impurity diffused region may be higher than or substantially equal to that of said second impurity diffused region.

In an embodiment of the semiconductor device according to the invention, both of said first and second impurity diffused regions are connected to said control electrode. In another preferable embodiment said first impurity diffused region is connected to said control electrode and said second impurity diffused region is connected with an insulating layers In another embodiment of the semiconductor device according to the invention, said first impurity diffused region is connected to said control electrode and said second impurity diffused region is connected to a floating potential According to the invention, said control region may consist of an impurity diffused region having the other conductivity type, and a separate region formed by a part of the semiconductor substrate of the one conductivity type.

According to a further aspect of the invention, a semiconductor device comprises;
- a semiconductor substrate made of a semiconductor material having one conductivity type and including mutually opposing first and second major surfaces;
- a plurality of first major electrodes aligned on said first major surface of the semiconductor substrate;
- a plurality of control electrodes formed on said first major surface of the semiconductor substrate;
- a plurality of control regions of the other conductivity type, each of said control regions being formed in the semiconductor substrate under a respective one of said control electrodes; and
- a second major electrode formed on the second major surface of the semiconductor substrate;
- wherein a current flowing between said first major electrodes and said second major electrode through channels formed within the semiconductor substrate is controlled by a control voltage applied to said control electrodes, and each of said control regions formed between adjacent channels includes a portion whose impurity concentration is decreased in accordance with an increase in a distance from the adjacent channels.

According to still a further aspect of the invention, a semiconductor device comprises:
- a semiconductor substrate made of a semiconductor material having one conductivity type and including mutually opposing first and send major surfaces;
- a plurality of first major electrodes aligned on said first major surface of the semiconductor substrate;
- a plurality of control electrodes formed on said first major surface of the semiconductor substrate;
- a plurality of control regions of the other conductivity type, each of said control regions being formed in the semiconductor substrate under a respective one of said control electrodes: and
- a second major electrode formed on the second major surface of the semiconductor substrate;
- wherein a current flowing between said first major electrodes and said second major electrode through channels formed within the substrate is controlled by a control voltage applied to said control electrodes, and each of said control regions formed between adjacent channels includes a plurality of impurity diffused regions having the other conductivity type whose impurity concentration profile includes a descending portion in accordance with an increase in a distance from the channels.

According to the invention, said plurality of impurity diffused regions may be partially overlapped with each other or may be separated from one another.

According to a further aspect of the invention, a semiconductor device comprises:
- a semiconductor substrate made of a semiconductor material having one conductivity type and including mutually opposing first and second major surfaces;
- a first major electrode formed on said first major surface of the semiconductor substrate;
- a control electrode formed on said first major surface of the semiconductor substrate;
- a control region of the other conductivity type formed in the semiconductor substrate under said control electrode; and
- a second major electrode formed on the second major surface of the semiconductor substrate;
- wherein a current flowing between said first major electrode said second major electrode through a channel formed within the semiconductor substrate is controlled by a control voltage applied to said control electrode, and said control region having the other conductivity type is formed to have a portion in which a carrier lifetime is locally decreased by selective irradiation with a-gamma-ray, electron-ray or proton-ray.

According to a further aspect of the invention, a semiconductor device comprises:
- a semiconductor substrate made of a semiconductor material having one conductivity type and including mutually opposing first and second major surfaces;
- a first major electrode formed on said first major surface of the semiconductor substrate;
- a control electrode formed on said first major surface of the semiconductor substrate;
- a control region of the other conductivity type formed in the semiconductor substrate under said control electrode; and
- a second major electrode formed on the second major surface of the semiconductor substrate;
- wherein a current flowing between said first major electrode and said second major electrode through a channel formed within the semiconductor substrate is controlled by a control voltage applied to said control electrode, and a peripheral portion of said control region having the other conductivity type is formed such that a carrier lifetime of said peripheral portion is locally decreased by selective irradiation with a gamma-ray, electron-ray or proton-ray.

DESCRIPTION OF THE PREFERRED EMBODIMENTS

Figure 1:
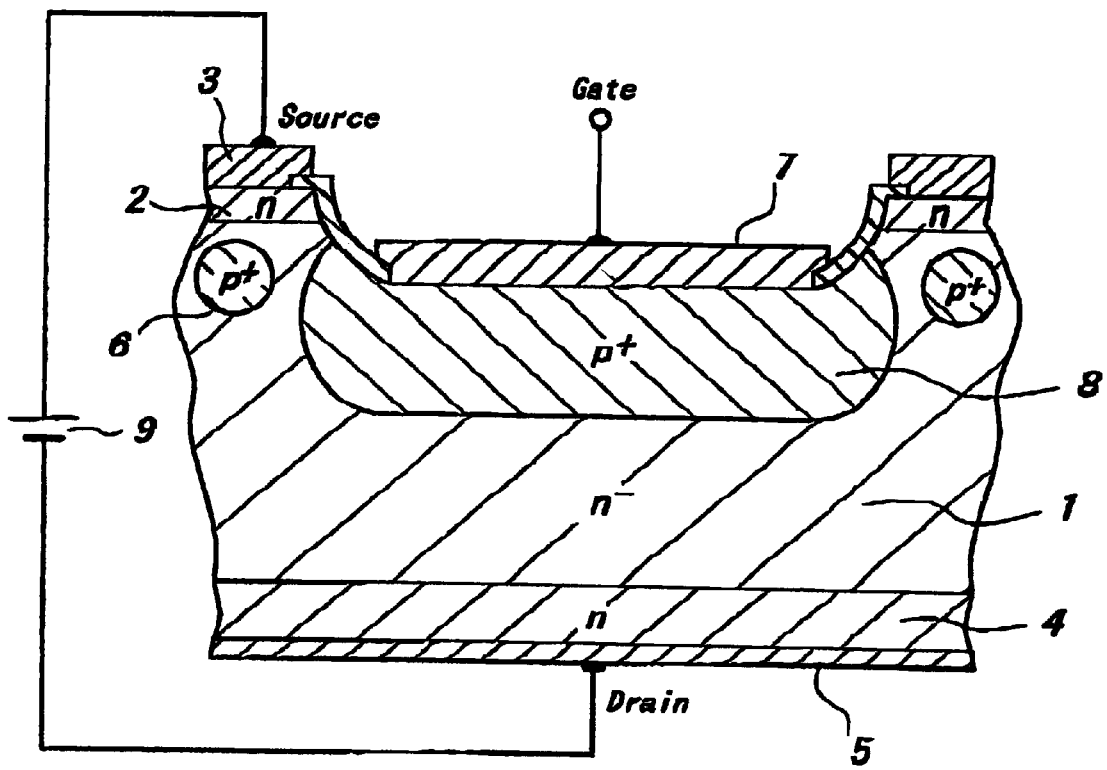
FIG. 1 is a cross sectional view showing schematically a structure of a known static induction transistor.

Now the present invention will be explained in detail with reference to several embodiments shown in the accompanying drawings. In these embodiments, similar portions are denoted by the same reference numerals. Furthermore, in the drawings, various regions and electrodes of the semiconductor devices are denoted schematically and a relation in size of these regions and electrodes differ from the actual relation.

Figure 2:
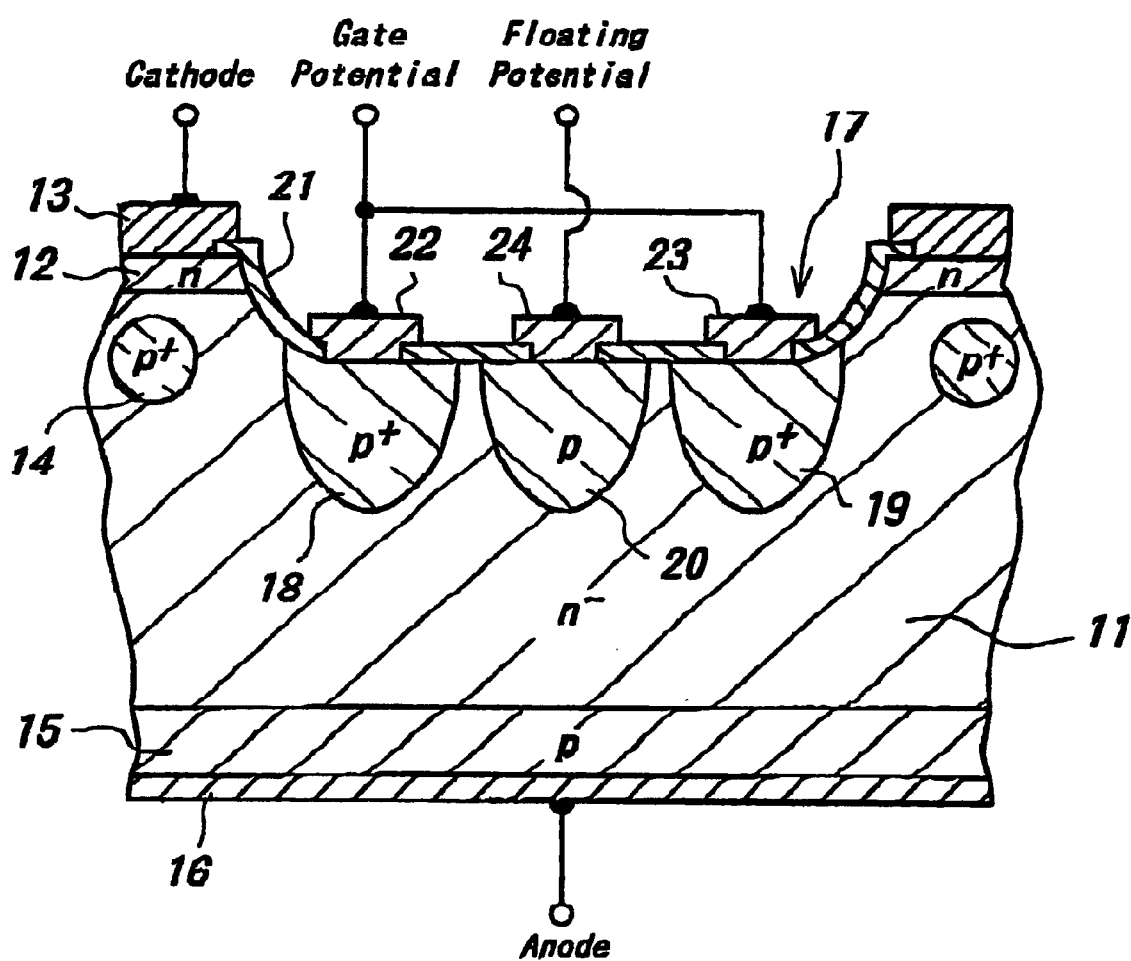
FIG. 2 is a schematic cross sectional view illustrating a first embodiment of the semiconductor device according to the invention constructed as a static induction transistor.

FIG. 2 is a schematic cross sectional view showing a first embodiment of the semiconductor device according to the invention. In the present embodiment, the semiconductor device is constructed as a static induction thyristor (SI thyristor). An n$^-$ type semiconductor substrate 11 is made of silicon having an impurity concentration of about $1 \times 10^{13}$–$1 \times 10^{14}$ atoms/cm$^3$. In one major surface of the silicon substrate 11, there are formed n$^+$ type cathode regions 12 and cathode electrodes 13 are formed on these cathode regions 12. Within a bulk of the silicon substrate 11 under the cathode regions 12, there are formed p$^+$ type buried gate regions 14 having an impurity concentration of about $5 \times 10^{18}$ atoms/cm$^3$. Portions of the bulk of the silicon substrate 11 at which the buried gate regions 14 are formed are called channels. In the other major surface of the silicon substrate 11, there is formed a single p type anode region 15 having an impurity concentration of about $5 \times 10^{18}$ atoms/cm$^3$, and an anode electrode 16 is formed on the anode region 15.

In the one major surface of the silicon substrate 11 there are formed recesses 17 between successive channels. In FIG. 2 only a single recess 17 is shown, but in an actual device a plurality of recesses are formed between adjacent channels. The above mentioned n$^+$ type cathode region 12 constitutes a so-called mesa structure. The recess 17 may be formed by a single isotropic etching process in the manner well known in the art. Impurities of the other conductivity type are driven into the silicon substrate 11 from the bottom of the recess 17 by diffusion to form first and second p$^+$ type guard regions 18 and 19 having an impurity concentration of about $5 \times 10^{18}$ atoms/cm$^3$ and a third p type guard region 20 having an impurity concentration of about $1 \times 10^{17}$ atoms/cm$^{17}$. The first and second guard regions 18 and 19 are formed to be adjacent to the channel region, and the third guard region 20 is formed between the first and second guard regions 18 and 19. The third guard region 20 serves as an auxiliary guard, and therefore it is sometimes called an auxiliary guard region in this specification. These guard regions 18–20 each have a depth of not less than 3 $\mu$m as in conventional static induction thyristors. In the present embodiment, the first, second and third guard regions 18, 19 and 20 are spatially separated from one another. Therefore, regions made of the bulk of the n$^-$ type silicon substrate 11 are existent between these guard regions. Then, the p type impurity concentration of the guard region is decreased in accordance with an increase in a distance from the channel. That is to say, a concentration of p type impurities of the guard region is gradually decreased away from the channel.

According to the present invention, since the impurity concentration of the guard regions 18–20 is decreased in accordance with an increase in a distance from the channel, and therefore during the conduction state of the channel, majority carriers, i.e. electrons scarcely diffuse under central portions of the guard regions 18–20. Therefore, when the channel is to be closed, electrons can be removed promptly and a high speed turn-off operation can be attained. Moreover, the turn-off operation is performed uniformly, and the semiconductor device can be effectively prevented from being broken.

On the recess 17 there is formed a silicon oxide film 21, and control electrodes 22, 23 and 24 are formed on the silicon oxide film such that they are connected to the guard regions 18, 19 and 20, respectively via contact holes formed in the silicon oxide film 21. The control electrodes 22 and 23 are commonly connected to a gate potential, but the auxiliary control electrode 24 connected to the auxiliary guard region 20 is connected to a floating potential. When the auxiliary guard regions 20 are connected to the floating potential by means of the auxiliary electrodes 24, unevenness in potential of the auxiliary guard regions 20 can be suppressed. This is quite effective for the high power semiconductor device, because in such a high power device, the auxiliary regions are liable to have different potentials.

Figure 3:
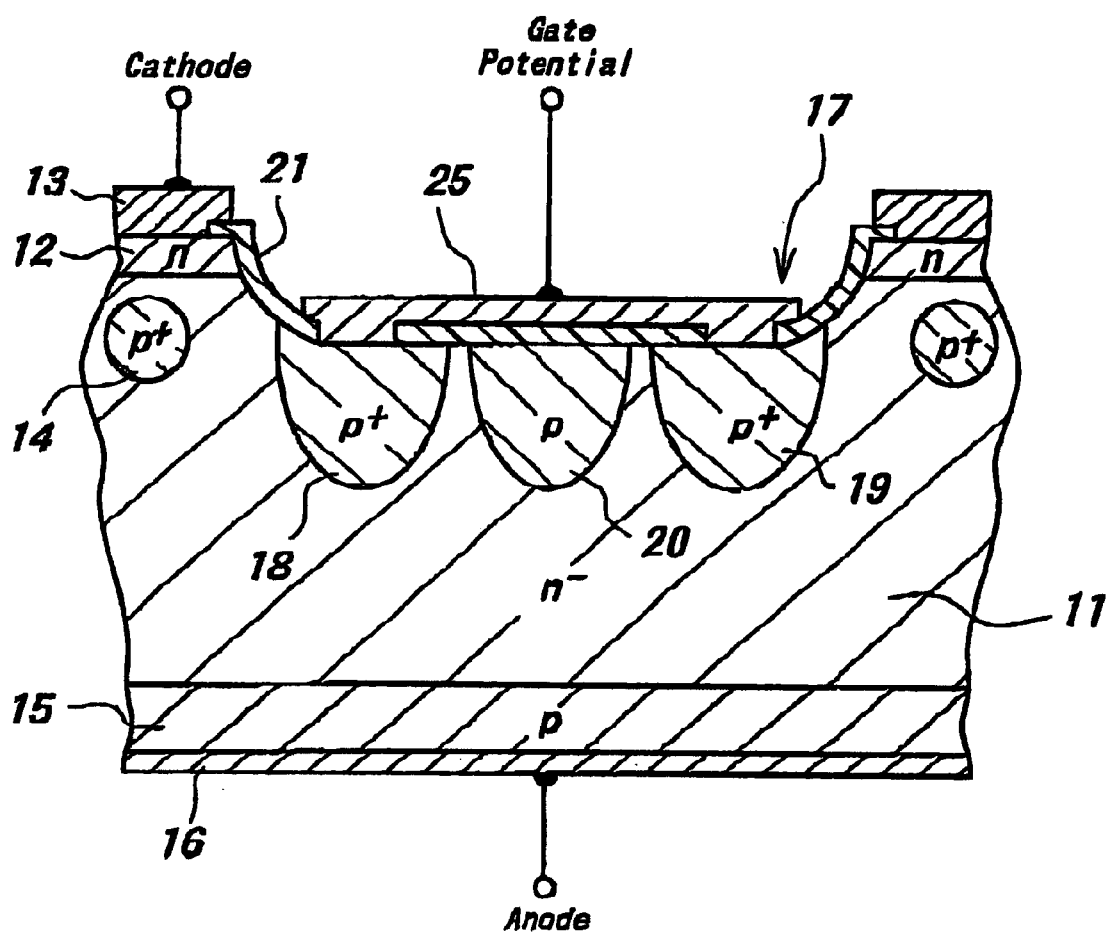
FIG. 3 is a schematic cross sectional view depicting a second embodiment of the semiconductor device according to the invention.

FIG. 3 is a schematic cross sectional view illustrating a second embodiment of the semiconductor device according to the invention. Also in this embodiment, under a recess 17 formed in one major surface of a silicon substrate 11, there are formed p$^+$ type guard regions 18–20 by diffusion such that they are spatially separated from one another. That is to say, n$^-$ silicon bulk of the substrate 11 is existent between the successive guard regions 18–20. In the present embodiment, contact holes are formed in a silicon oxide film 21 at positions corresponding to the p$^+$ type guard regions 18 and 19, and a single control electrode 25 is formed to be connected to these guard regions 18 and 19.

Figure 4:
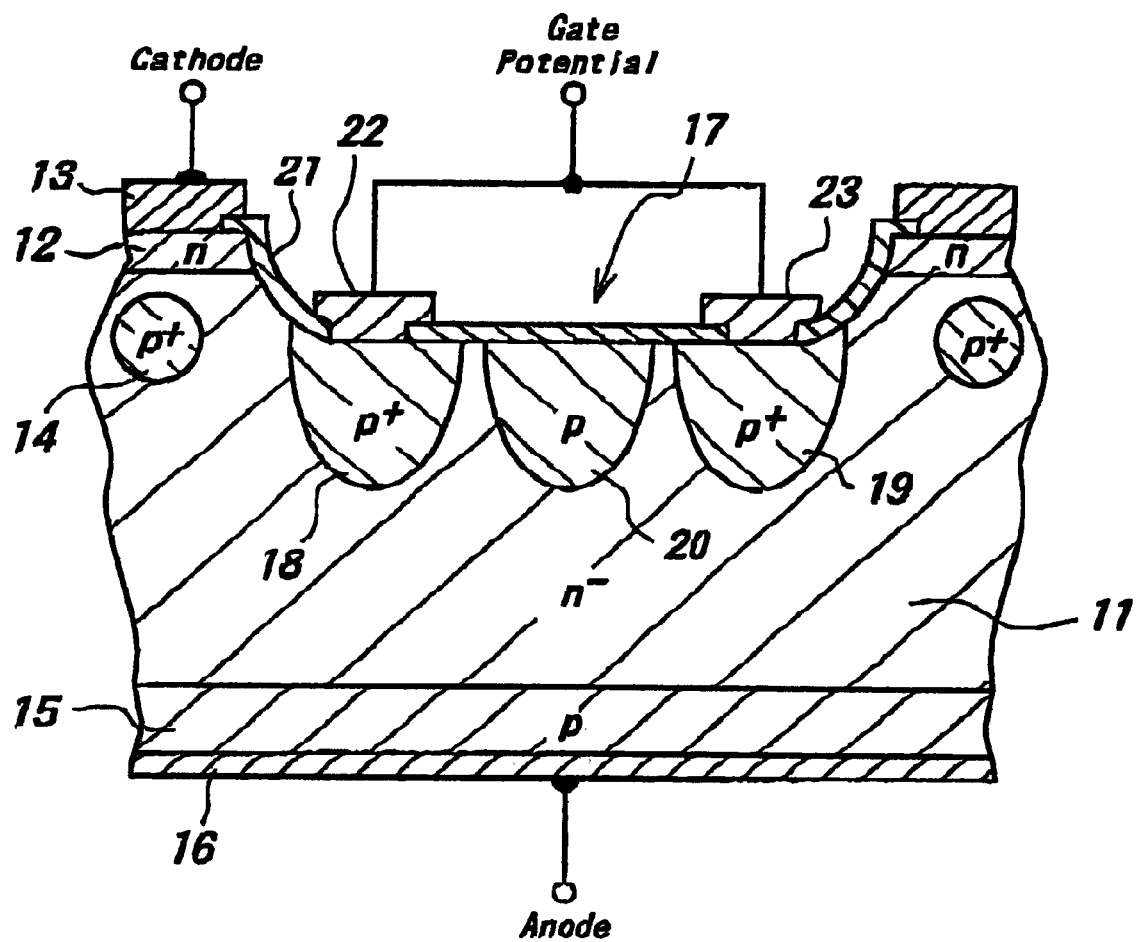
FIG. 4 is a schematic cross sectional view showing a third embodiment of the semiconductor device according to the invention.

FIG. 4 is a schematic cross sectional view illustrating a third embodiment of the semiconductor device according to the invention. Also in this embodiment, under a recess 17 formed in one major surface of an n$^+$ silicon substrate 11, p$^+$ type guard regions 18–20 are formed to be spatially separated from one another by means of a bulk of the n$^-$ silicon substrate. In the present embodiment, contact holes are formed in a silicon oxide film 21 at positions corresponding to the guard regions 18 and 19, and control electrodes 22 and 23 formed to be connected to the guard regions 18 and 19, respectively via the contact holes. In this manner, no control electrode is formed above the auxiliary guard region 20. When no electrode is provided above the auxiliary guard region 20, an electric field is released across the insulating film covering the auxiliary guard region and the reliability is improved.

Figure 5:
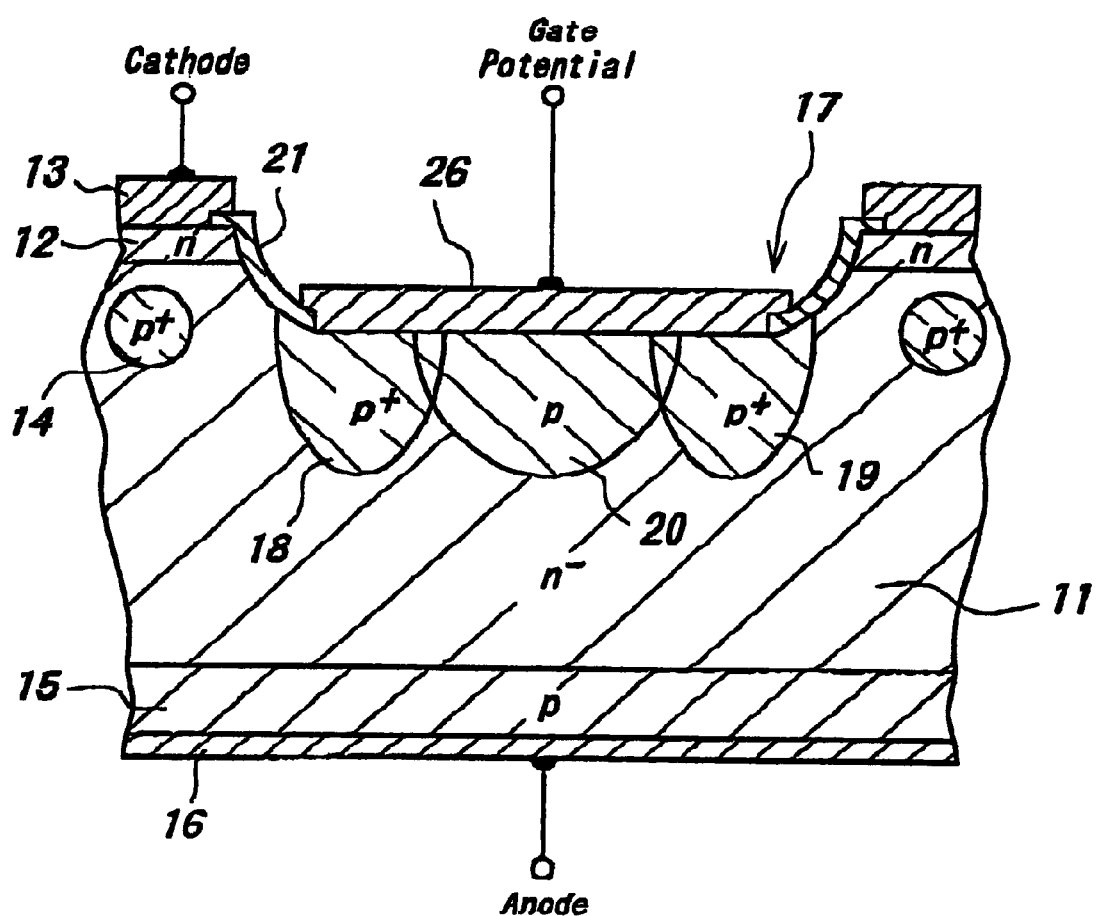
FIG. 5 is a schematic cross sectional view illustrating a fourth embodiment of the semiconductor device according to the invention.

FIG. 5 is a schematic cross sectional view showing a fourth embodiment of the semiconductor device according to the invention. In the first to third embodiments so far explained, the three guard regions 18–20 are formed to be spatially separated from one another, but in the present embodiment, three guard regions 18–20 are formed to be partially overlapped with one another at their side portions. Furthermore, a single contact hole is formed in a silicon oxide film 21 formed on a recess 17, and a large control electrode 26 is formed to be connected to the guar regions 18–20 via the contact hole.

Also in the present embodiment, a concentration of p$^+$ type impurity is decreased at side portions of the guard regions 18–20 at which these guard regions are overlapped with one another, and therefore there are formed portions in which an impurity concentration is decreased away from the channel. This results in that the turn-off operation can be performed at a very high speed. Moreover, since electrons are uniformly withdrawn from the regions under the guard regions 18–20. the semiconductor device can be effectively prevented from being destroyed.

Figure 6:
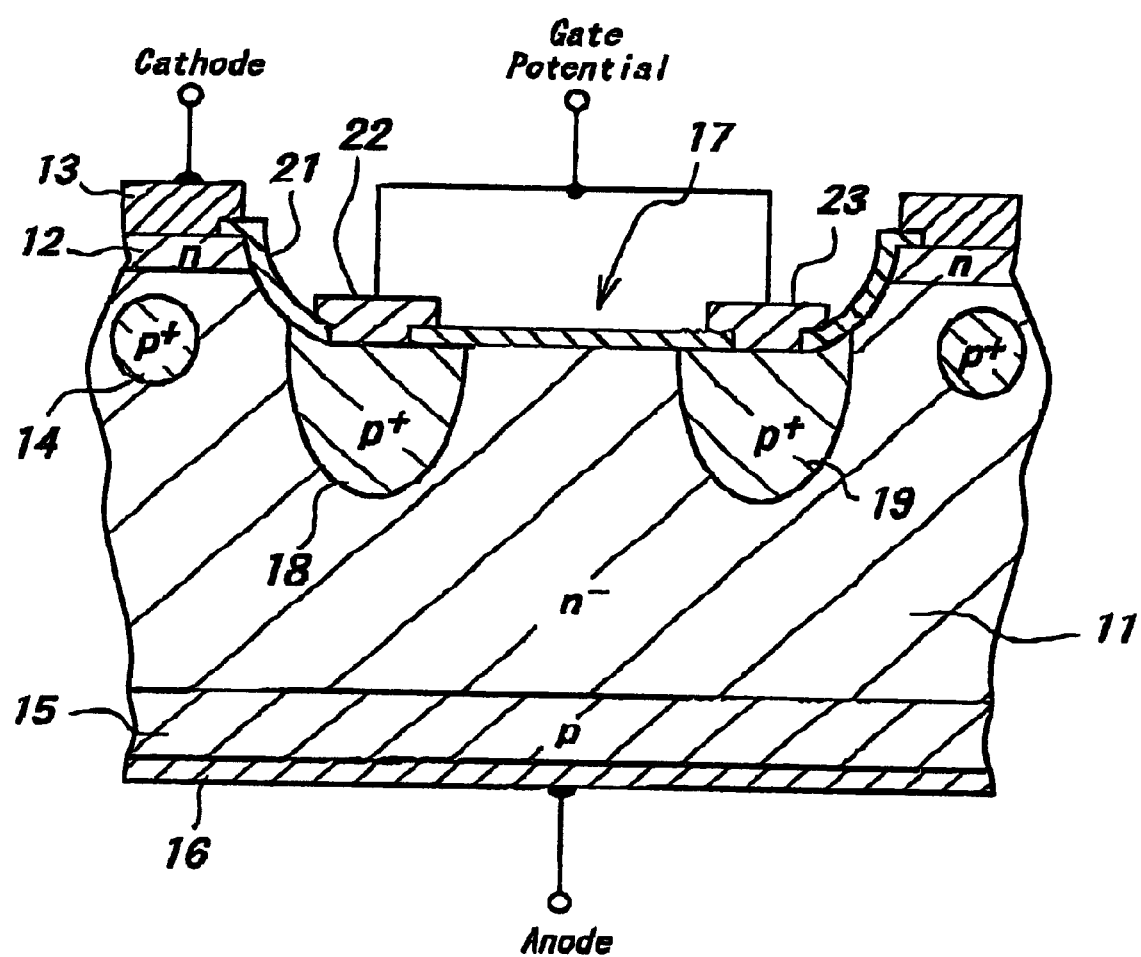
FIG. 6 is a schematic cross sectional view showing a fifth embodiment of the semiconductor device according to the invention.

FIG. 6 is a cross sectional view illustrating schematically a fifth embodiment of the semiconductor device according to the invention. In the above mentioned first to fourth embodiments, the three guard regions 18–20 are formed by introducing p type impurity into an area between successive channels. In the present embodiment, only first and second guard regions 18 and 19 are formed to be separated from each other. Then, the auxiliary guard region 20 of the previous embodiments is cut out from the bulk of the n⁻ silicon substrate 11. Therefore, the guard region includes portions in which the concentration of p type impurity becomes smaller in accordance with in increase in a distance from the channel. Then, electrons could be hardly spread laterally and can be processed at a high speed upon the turn-off operation. Moreover, the electrons are taken out uniformly and the semiconductor device is free from destroy.

Figure 7:
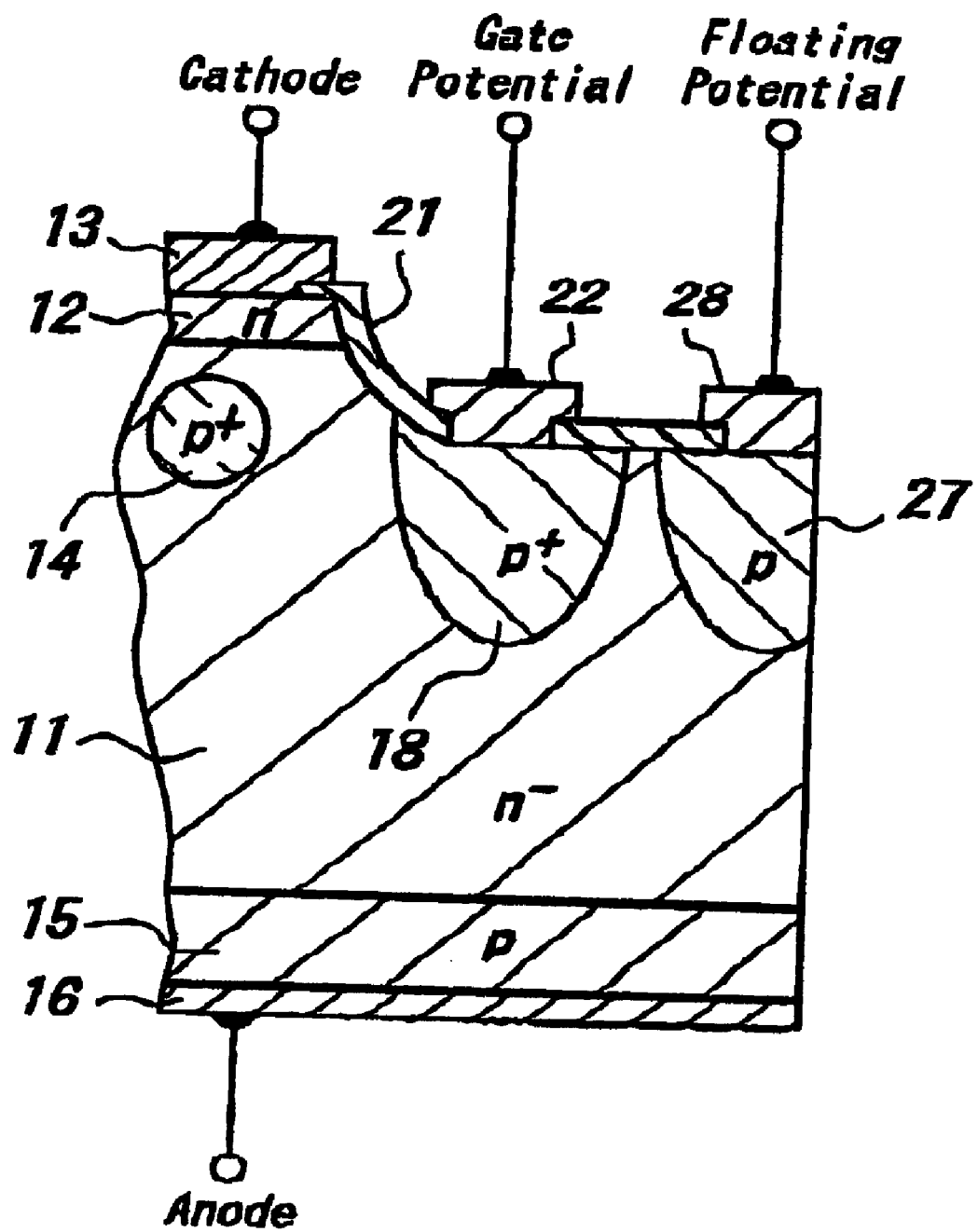
FIG. 7 is a cross sectional view illustrating schematically a sixth embodiment of the semiconductor device according to the invention.

FIG. 7 is a cross sectional view depicting a sixth embodiment of the semiconductor device according to the invention. In the embodiments so far explained, the guard regions 18–20 are formed between successive channels, but in the present embodiment, guard regions are formed on an outer side of the outermost channel. That is to say, a p⁺ type guard region 18 is formed on an outer side of the outermost channel, and p type auxiliary guard region 27 is formed on an outer side of the p⁺ type guard region 18. The p⁺ type guard region 18 is connected to the gate potential by means of a control electrode 22 and a contact hole formed in a silicon oxide film 21. The p type auxiliary guard region 27 is connected to a floating potential via an auxiliary control electrode 28 which is connected to the p type auxiliary guard region 27 through a contact hole formed in the silicon oxide film 21.

Also in the present embodiment, the guard regions 18 and 27 are formed such that a concentration of p type impurity becomes lower away from the channel, and therefore like as the previous embodiments, electrons are hardly spread laterally while the semiconductor device is in the conduction state. This results in that electrons can be taken out promptly at the turn-off and the high speed switching can be realized. Furthermore, the electron treatment is performed uniformly, and thus the electric field can hardly exceed locally and the semiconductor device can be prevented from being destroyed. In the present embodiment, the guard regions 18 and 27 are formed to be spatially separated from each other, but according to the invention these guard regions may be formed to be partially overlapped with each other.

It should be noted that the present invention is not limited to the embodiments explained above, but many alternations and modifications may be conceived by a person skilled in the art within the scope of claims. For instance, in the embodiments in which the three guard regions are provided, an impurity concentration of the central guard region 20 is smaller than that of both side guard regions 18 and 19. According to the invention, these three guard regions may have substantially equal impurity concentrations. Moreover, according to the invention, more than three guard regions may be provided to be separated from one another or to be partially overlapped with one another. In this case, a middle guard region farthest from adjacent channels has a lowest impurity concentration and an impurity concentration of guard regions is successively higher toward the channels. Alternately, all the guard regions may have substantially identical impurity concentration.

When three guard regions are provided between successive channels, a carrier life time may be locally shortened by selectively irradiating the central guard region and/or its peripheral portions with gamma-ray, electron-ray or proton-ray. When two guard regions are formed between successive channels, a middle region between the two guard regions may be selectively irradiated with the gamma-ray, electron-ray or proton-ray to locally decreasing a carrier life-time. In this manner, an impurity concentration just below the guard region can be effectively reduced. Even in a case in which only a single guard region is provided between adjacent channels, this guard region and/or its peripheral region may be selectively irradiated with gamma- ray, electron-ray or proton-ray to decrease the carrier life-time.

In the above embodiments, the semiconductor device according to the invention is realized as the buried gate type static induction thyristor, but according to the invention, the semiconductor device may be constructed as static induction thyristor of types other than the buried gate type or may be constructed as static induction transistor and gate-turn-off thyristor. Alternately, the semiconductor device according to the invention may be realized as an insulated gate type semiconductor device such as IGBT, IEGT and MCT. Moreover, in the above embodiments, the semiconductor substrate is made of silicon, but it may be made of other semiconductor materials.

As explained above in detail, in the semiconductor device according to the invention, a current flowing through a channel formed between first and second major electrodes formed on first and second major surfaces of the semiconductor substrate having one conductivity type is controlled by the control voltage applied to the control electrode provided on the first major surface of the semiconductor substrate, the control region having the other conductivity type is formed in the first major surface of the semiconductor substrate such that said control region includes a portion in which a concentration of the other conductivity type impurities is lowered in accordance with an increase in a distance from the channel. Therefore, when the channel is in the conduction state, a lateral spread of majority carriers is suppressed, and thus when the channel is closed, carriers can be withdrawn promptly and a high speed switching can be realized. Moreover, since the carriers are withdrawn uniformly, the electrical field could not exceed locally and the wider safety operating area can be attained. In this manner, according to the invention, it is possible to propose the semiconductor device in which a large current can be switched at a high speed in a reliable manner.

What is claimed is:

1. A semiconductor device comprising:
    a semiconductor substrate made of a semiconductor material having one conductivity type and including mutually opposing first and second major surfaces;
    a first major electrode formed on said first major surface of the semiconductor substrate;
    a control electrode formed on said first major surface of the semiconductor substrate;
    a control region of the other conductivity type formed in the semiconductor substrate under said control electrode; and
    a second major electrode formed on the second major surface of the semiconductor substrate;
    wherein a current flowing between said first major electrode and said second major electrode through a channel formed within the semiconductor substrate is controlled by a control voltage applied to said control electrode, and said control region is formed to have a portion whose impurity concentration is decreased in accordance with an increase in a distance from the channel.

2. A semiconductor device according to claim 1, wherein said control region is consisting of a first impurity diffusion region adjacent to the channel and a second impurity diffusion region situating on a side of said first impurity diffusion region opposite to the channel.

3. A semiconductor device according to claim 2, wherein said first and second impurity diffusion regions are spatially separated from each other.

4. A semiconductor device according to claim 2, wherein said first and second impurity diffusion regions are formed to be partially overlapped with each other.

5. A semiconductor device according to any one of claims 2–4, wherein an impurity concentration of said first impurity diffusion region is higher than that of said second impurity diffusion region.

6. A semiconductor device according to any one of claims 2–4, wherein an impurity concentration of said first impurity diffusion region is substantially identical with that of said second impurity diffusion region.

7. A semiconductor device according to any one of claims 2–4, wherein said first and second impurity diffusion regions are connected to said control electrode.

8. A semiconductor device according to any one of claims 2–4, wherein said first impurity diffusion region is connected to said control electrode and said second impurity diffusion region is covered with an insulating layer.

9. A semiconductor device according to any one of claims 2–4, wherein said first impurity diffusion region is connected to said control electrode and said second impurity diffusion region is connected to a floating potential.

10. A semiconductor device according to any one of claims 2–4, wherein said second impurity diffusion region include a region in which a carrier life time is locally decreased by selective irradiation with gamma-ray, electron-ray or proton-ray.

11. A semiconductor device according to any one of claims 2–4, wherein a periphery of said second impurity diffusion region is formed to have a region in which a carrier life time is locally decreased by selective irradiation with gamma-ray, electron-ray or proton-ray.

12. A semiconductor device according to claim 1, wherein said control region is consisting of an impurity diffusion region having the other conductivity type, and a separation region formed by a part of a bulk of the semiconductor substrate.

13. A semiconductor device according to claim 12, wherein said separation region includes a region in which a carrier life time is locally decreased by selective irradiation with gamma-ray, electron-ray or proton-ray.

14. A semiconductor device comprising:
a semiconductor substrate made of a semiconductor material having one conductivity type and including mutually opposing first and second major surfaces;
a plurality of first major electrodes aligned on said first major surface of the semiconductor substrate;
a plurality of control electrodes formed on said first major surface of the semiconductor substrate;
a plurality of control regions of the other conductivity type, each of said control regions being formed in the semiconductor substrate under respective one of said control electrodes; and
a second major electrode formed on the second major surface of the semiconductor substrate;
wherein a current flowing between said first major electrodes and said second major electrode through channels formed within the semiconductor substrate is controlled by a control voltage applied to said control electrodes, and each of said control regions formed between adjacent channels includes a portion whose impurity concentration is decreased in accordance with an increase in a distance from the adjacent channels.

15. A semiconductor device according to claim 14, wherein said control region formed between adjacent channels includes a region whose carrier life time is locally decreased by selective irradiation of gamma-ray, electron-ray or proton-ray.

16. A semiconductor device comprising:
a semiconductor substrate made of a semiconductor material having one conductivity type and including mutually opposing first and second major surfaces;
a plurality of first major electrodes aligned on said first major surface of the semiconductor substrate;
a plurality of control electrodes formed on said first major surface of the semiconductor substrate;
a plurality of control regions of the other conductivity type, each of said control regions being formed in the semiconductor substrate under respective one of said control electrodes; and
a second moor electrode formed on the second major surface of the semiconductor substrate;
wherein a current flowing between said first major electrodes and said second major electrode through channels formed within the semiconductor substrate is controlled by a control voltage applied to said control electrodes, and each of said control regions formed between adjacent channels includes a plurality of impurity diffusion regions having the other conductivity type whose impurity concentration profile includes a descending portion away from the channels.

17. A semiconductor device according to claim 16, wherein said plurality of impurity diffusion regions are formed to be partially overlapped with each other.

18. A semiconductor device according to claim 16, wherein said plurality of impurity diffusion regions are formed to be spatially separated from one another.

19. A semiconductor device according to any one of claims 16–18, wherein an impurity concentration of each of said plurality of impurity diffusion regions is decreased in accordance with an increase in a distance from the channels.

20. A semiconductor device according to any one of claims 16–18, wherein said plurality of impurity diffusion regions have substantially identical impurity concentration.

21. A semiconductor device according to any one of claims 16–18, wherein each of said control regions formed between adjacent channels include a portion having a locally decreased carrier life time by selective irradiation with gamma-ray, electron-ray or proton-ray.

22. A semiconductor device comprising:
a semiconductor substrate made of a semiconductor material having one conductivity type and including mutually opposing first and second major surfaces;
a first major electrode formed on said first major surface of the semiconductor substrate;
a control electrode formed on said first major surface of the semiconductor substrate;
a control region of the other conductivity type formed in the semiconductor substrate under said control electrode; and
a second major electrode formed on the second major surface of the semiconductor substrate;
wherein a current flowing between said first major electrode and said second major electrode through a channel formed within the substrate is controlled by a control voltage applied to said control electrode, and said control region having the other conductivity type is formed to have a portion in which a carrier life time is decreased locally by selective irradiation with gamma-ray, electron-ray or proton-ray.

23. A semiconductor device comprising:
a semiconductor substrate made of a semiconductor material having one conductivity type and including mutually opposing first and second major surfaces;

a first major electrode formed on said first major surface of the semiconductor substrate;

a control electrode formed on said first major surface of the semiconductor substrate;

a control region of the other conductivity typo formed in the semiconductor substrate under said control electrode; and a second major electrode formed on the second major surface of the semiconductor substrate;

wherein a current flowing between said first major electrode and said second major electrode through a channel formed within the semiconductor substrate is controlled by a control voltage applied to said control electrode, and a periphery of said control region having the other conductivity type includes a portion in which a carrier life time is locally decreased by selective irradiation with gamma-ray, electron-ray or proton-ray.

* * * * *